United States Patent
Ko et al.

(10) Patent No.: US 7,855,502 B2
(45) Date of Patent: Dec. 21, 2010

(54) DISPLAY DEVICE AND METHOD OF DRIVING THE SAME

(75) Inventors: Sam Min Ko, Incheon (KR); Sung Ho Mo, Cheongju-si (KR)

(73) Assignee: LG Display Co., Ltd., Seoul (KR)

( * ) Notice: Subject to any disclaimer, the term of this patent is extended or adjusted under 35 U.S.C. 154(b) by 404 days.

(21) Appl. No.: 11/708,351

(22) Filed: Feb. 21, 2007

(65) Prior Publication Data

US 2007/0247065 A1 Oct. 25, 2007

(30) Foreign Application Priority Data

Apr. 24, 2006 (KR) ........................ 10-2006-0036750

(51) Int. Cl.
*H05B 33/00* (2006.01)

(52) U.S. Cl. ..................... 313/503; 313/326; 313/632; 313/583

(58) Field of Classification Search ................. 313/505, 313/500
See application file for complete search history.

(56) References Cited

U.S. PATENT DOCUMENTS

| | | | |
|---|---|---|---|
| 6,864,637 B2 | 3/2005 | Park et al. | |
| 6,914,388 B2 | 7/2005 | Shin et al. | |
| 7,023,013 B2 | 4/2006 | Ricks et al. | |
| 7,038,373 B2 | 5/2006 | Arnold et al. | |
| 7,119,733 B2 | 10/2006 | Schoeberl et al. | |
| 7,142,179 B2 | 11/2006 | Miller et al. | |
| 7,301,276 B2 * | 11/2007 | Yamazaki et al. | 313/506 |
| 2001/0030508 A1 * | 10/2001 | Utsugi et al. | 313/505 |
| 2004/0195959 A1 * | 10/2004 | Park et al. | 313/500 |
| 2005/0151707 A1 | 7/2005 | Park | |
| 2006/0055632 A1 | 3/2006 | Ha et al. | |
| 2006/0139262 A1 | 6/2006 | Lee | |
| 2006/0146827 A1 | 7/2006 | Kim | |
| 2006/0262049 A1 | 11/2006 | Kim | |
| 2007/0126340 A1 * | 6/2007 | Chang Chien et al. | 313/500 |

FOREIGN PATENT DOCUMENTS

KR 10-2005-0025791 3/2005

* cited by examiner

*Primary Examiner*—Ashok Patel
(74) *Attorney, Agent, or Firm*—Morgan Lewis & Bockius LLP

(57) ABSTRACT

A display panel includes a first plurality of scan lines, a second plurality of scan lines, and a cell section that includes first and second electrode layers that cross form a plurality of display cells. Each cell includes a light-emitting layer which is formed between the first and second electrode layers. The panel also includes a plurality of contacts, each of which electrically couples at least one of the first or second scan lines to a corresponding one of the second electrode layers. One or more of the contacts have a dimension which is different from a dimension of one of the display cells.

22 Claims, 6 Drawing Sheets

DISPLAY DEVICE AND METHOD OF DRIVING THE SAME

BACKGROUND

1. Field

One or more embodiments described herein relate to a display device.

2. Background

A variety of display devices have been developed. These devices include electroluminescent displays, plasma display panels and liquid crystal displays as well as others. In related-art devices, the electrode layers and their associated contacts tend to correspond identically in size to the luminescent areas of the display. These and other structural limitations serve as a deterrent to miniaturization. A need therefore exists for display devices which have different or improved size and operational efficiencies compared with the related-art.

BRIEF DESCRIPTION OF THE DRAWINGS

The embodiments will be described in detail with reference to the following drawings in which like reference numbers refer to like elements, wherein.

DETAILED DESCRIPTION

Figure 1:
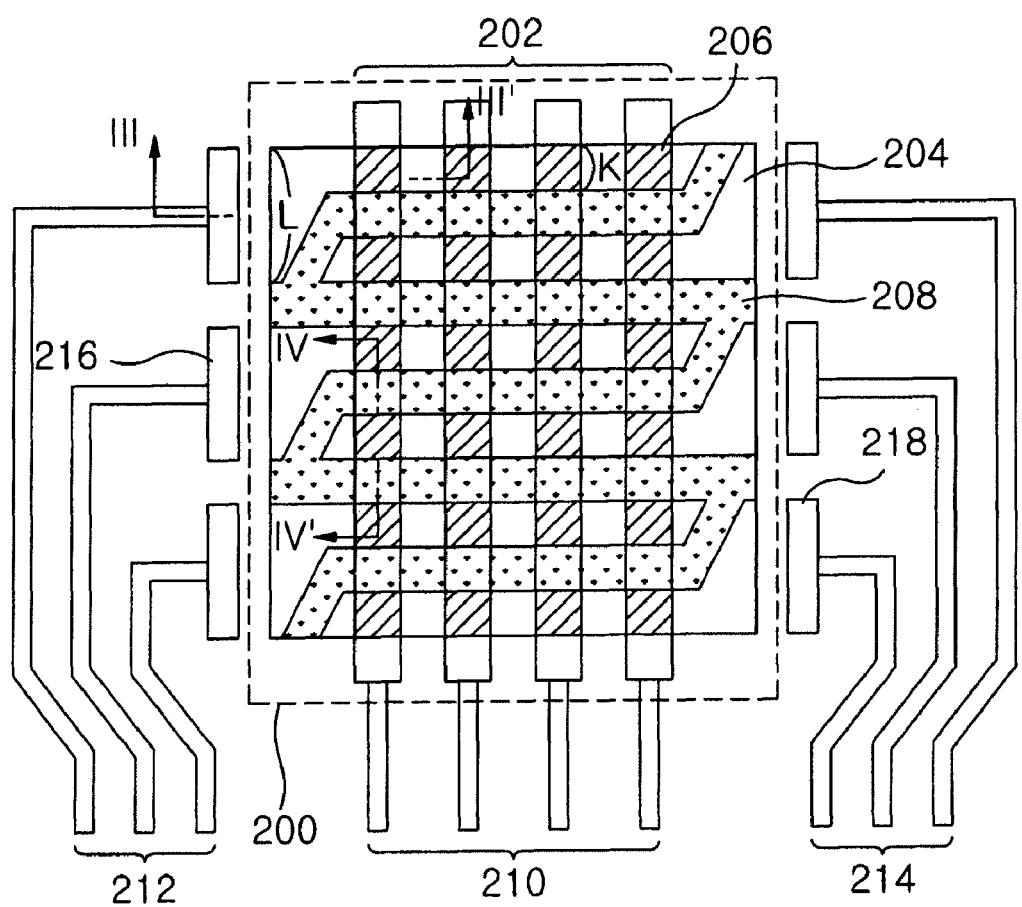
FIG. 1 is a view showing one embodiment of a display device.

FIG. 1 shows one embodiment of a display device in which a driver (not shown) is coupled to ends of lines 210, 212 and 214. The display device further includes a cell section 200, data lines 210, first scan lines 212, second scan lines 214, first contact hole sections 216 and second contact hole sections 218. Hereinafter, an organic electroluminescent device will be described as an example of the display device for convenience of the description. Although the description is given to an electroluminescent (EL) device, the embodiments described herein may be readily applied to other types of device devices including but not limited to plasma display panels, liquid crystal displays, as well as others.

The cell section 200 includes first electrode layers 202, second electrode layers 204, and a wall 208. Each of the electrode layers 202 and 204 serves as a conductor. In a case where the display device is a passive matrix organic electroluminescent device, the first electrode layers 202 may be anode electrode layers and the second electrode layers 204 may be cathode electrode layers. The first electrode layers 202 form transparent electrodes made of, for example, indium tin oxide and the second electrode layers 204 may be made of metal, e.g. aluminum (Al). The anode and cathode layers will be described as an example of the first electrode layers 202 and second electrode layers 204 for convenience.

One end of at least one cathode electrode layer 204 has a width (L) that is wider than a width (K) of a part corresponding to luminescent area(s). According to one embodiment, the end of cathode electrode layer 204 may have a width L greater than 2K, to increase the width of the contact hole sections 216 and 218 corresponding to the cathode electrode layers. As a result, the contact hole sections 216 and 218 will not be formed with long dimensions in the longitudinal direction in the exterior area of the cell section 200. Sub-pixels 206 (e.g., luminescent areas) are formed in crossed areas of the anode and cathode electrode layers. In accordance with one embodiment, each pixel of the display device may be formed from a plurality of sub-pixels, where each sub-pixel corresponds to a different color, e.g., red, green, or blue.

As further shown in FIG. 1, the wall 208 is made up of an insulating material and serves to separate the cathode electrode layers 204 so that the cathode electrode layers are not short-circuited. Wall or partition 208 also separates the cathode electrode layers so that the width L of one end of each cathode electrode layer is wider than the width K of a part corresponding to the luminescent area.

The first contact hole sections 216 and second contact hole sections 218 are disposed in the exterior area of the cathode electrode layers 204, and have widths that may correspond to the width L of ends of the cathode electrode layers. At least one contact hole section 216 and 218 may have the same width L as the end of the cathode electrode layers.

The data lines 210 are respectively coupled to anode electrode lathers 202, and first scan lines 212 are coupled to some of the cathode electrode layers through first contact hole sections 216. The second scan lines 214 are coupled to the other cathode electrode layers through the second contact hole sections 218.

For example, the first scan lines 212 are coupled to odd number cathode electrode layers through the first contact hole sections 216, and the second scan lines 214 are coupled to even number cathode electrode layers through the second contact hole sections 218. This coupling structure will now be described in greater detail.

Figure 2A:
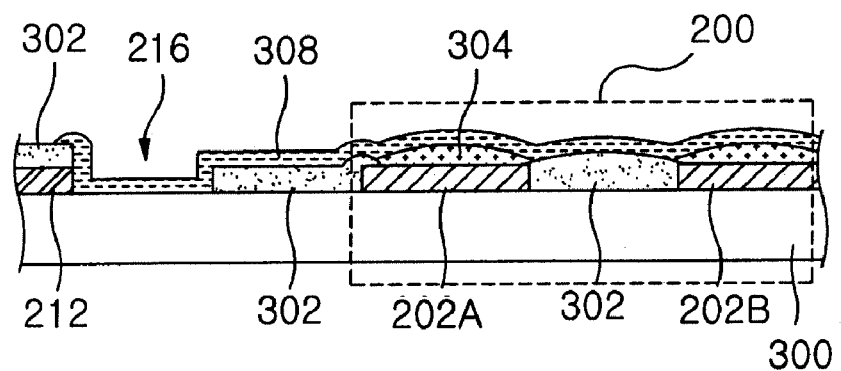
FIG. 2A is a sectional view of the display device taken along line III-III' of FIG. 1.

As shown in FIG. 2A, anode electrode layers 202A and 202B and one or more organic layers 304 are formed in sequence on substrate 300. At least one of the organic layers 304 includes an emitting layer EML made of an organic material (e.g., an organic electroluminescent layer) corresponding to red, green, or blue light. In alternative embodiments, three organic layers are included, one for each of the three colors. According to another alternative, at least one of the organic layers 304 includes a hole transporting layer HTL, EML and an electron transporting layer ETL.

An insulating layer 302 is deposited on areas except preferably the luminescent areas and contact hole areas 216 and 218 of the display device. The anode electrode layers 202 are formed on the substrate and then insulating material is deposited on preferably the whole area of the substrate. The insulating material deposited on the luminescent areas and the part corresponding to contact hole sections 216 and 218 are then removed using a mask to thereby form insulating layer 302. The insulating layer 302 is formed between anode electrode layers 202A and 202B to ensure that the anode electrode layers are not short-circuited.

Figure 2B:
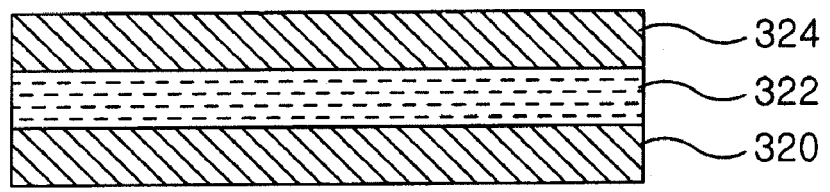
FIG. 2B is a sectional view of a scan line that may be included in the display device.

As shown in FIG. 2B, the first scan line 212 may be formed outside the first contact hole section 216 and is preferably made of a first conducting later 320, a metal layer 322 and a second conducting layer 324 formed in sequence on the substrate. Conducting layers 320 and 324 may be made of, for example, molybdenum (Mo) and metal layer 322 may be made of the same material as cathode electrode layers 204.

A metal material layer 308 may be deposited on the substrate on which the anode electrode layers 202A and 202B, the insulating layers 302, the organic layers 304 and the first scan line 212 are formed. The metal material layer is coupled to the first scan line 212 through the first contact hole section 216.

On the other hand, a part corresponding to the cell section of the metal material layer 308 may correspond to cathode electrode layer 204. As a result, the cathode electrode layer is coupled to the first scan line 212 through the first contact hole section 216. In this way, the second scan line 214 is coupled to the cathode electrode layer 204 through the second contact hole section 218.

Figure 2C:
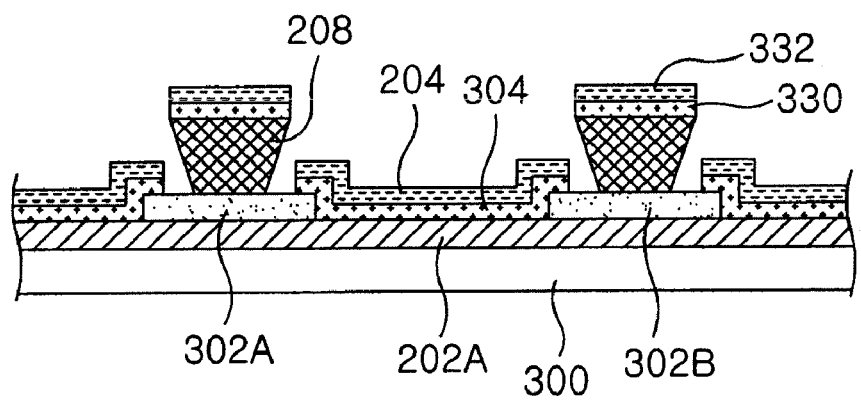
FIG. 2C is a sectional view of the display device taken along line IV-IV'.

As shown in FIG. 2C, the anode electrode layer 202A, organic layer 304 and cathode electrode layer 204 are formed in sequence on the substrate. Additionally, insulating layer 302A and 302B and wall 208 are formed in sequence on anode electrode layer 202A. In other words, wall 208 is disposed to separate cathode electrode layers 204.

In the display device according to one or more of the aforementioned embodiments, the width L of one end of each of the cathode electrode layers 204 is greater than the width K of the part corresponding to the luminescent area. Therefore, though the contact hole sections 216 and 218 are not formed to have long dimensions in longitudinal direction in the exterior area of cell section 200, contact hole sections 216 and 218 may have the same or different area as the contact hole sections 216 and 218. Accordingly, the display device may be smaller than related-art display devices.

As previously described, when certain voltages are provided to electrode layers 202 and 204, light of a certain wavelength is emitted from organic layer 304. The emitted light mall be transmitted in the direction of the first electrode layer 202 (bottom-type display device) or may be transmitted in the direction of the second electrode later 204 (top-type display device).

In the case where the display device is a bottom-type device, the light emitted from the organic layer 304 is transmitted outside the display through first electrode layer 202 and substrate 300. The first electrode layer (e.g., anode electrode layer) may be a transparent electrode having low work function. The second electrode layer 204 (e.g., cathode electrode layer) may be made of a reflective material having high work function to reflect the emitted light in the direction of the first electrode layer 202.

In the case where the display device is top-type device, light emitted from the organic layer 304 is transmitted outside the display through the second electrode layer 204. Accordingly, the second electrode layer may be made of a transparent material, e.g., thin metal. The first electrode layer 202 may be made of a reflective material to reflect the emitted light in direction of the second electrode layer 204.

A display device according to any one of the aforementioned embodiments may therefore have different structures or features depending on whether the device is a bottom-type device or top-type device. For both the bottom- and top-type devices, the end of the second electrode layer 204 preferably has a width L greater than K, and preferably may be 2K or more, where the K is width of the part corresponding to the luminescent area.

According to another embodiment, the first electrode layer 202 may be a cathode electrode layer and the second electrode layer 204 may be an anode electrode layer. One end of the anode electrode layer has a width greater than a luminescent area, and preferably has a width of 2 times or more of the width of the luminescent area.

Figure 3:
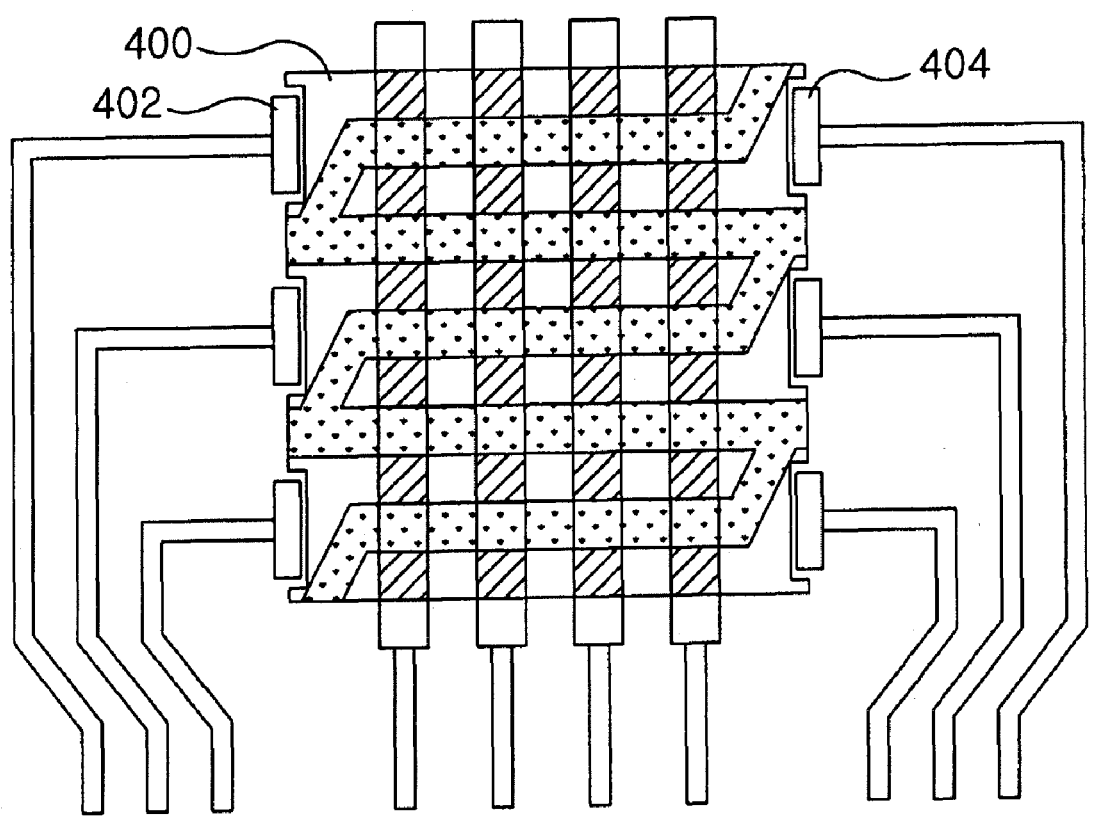
FIG. 3 is a diagram showing another embodiment of a displays device.

FIG. 3 shows a display device according to another embodiment where recesses 410 are formed at ends of cathode electrode layers 400. Contact hole sections 402 and 404 are preferably formed to correspond to the cathode electrode layers 400. In this embodiment, the display device may have various structures are described for previous embodiments provided at least one end of the cathode electrode layer has width different from and preferably wider than the luminescent area. In this case, the contact hole sections are formed to correspond to the cathode electrode layers.

In accordance with at least one of the aforementioned embodiments, one end of the cathode electrode layer (line) has a width greater than a part corresponding to the luminescent area (one scan line and one cathode line on a sub-pixel basis), and thus the contact hole section is not formed with long dimensions in the direction outside the cell section. Accordingly, the size of the light emitting device may be reduced. In accordance with another embodiment, the contact part may be the same as the end region of the scan line or cathode line on a sub-pixel basis.

Figure 4:
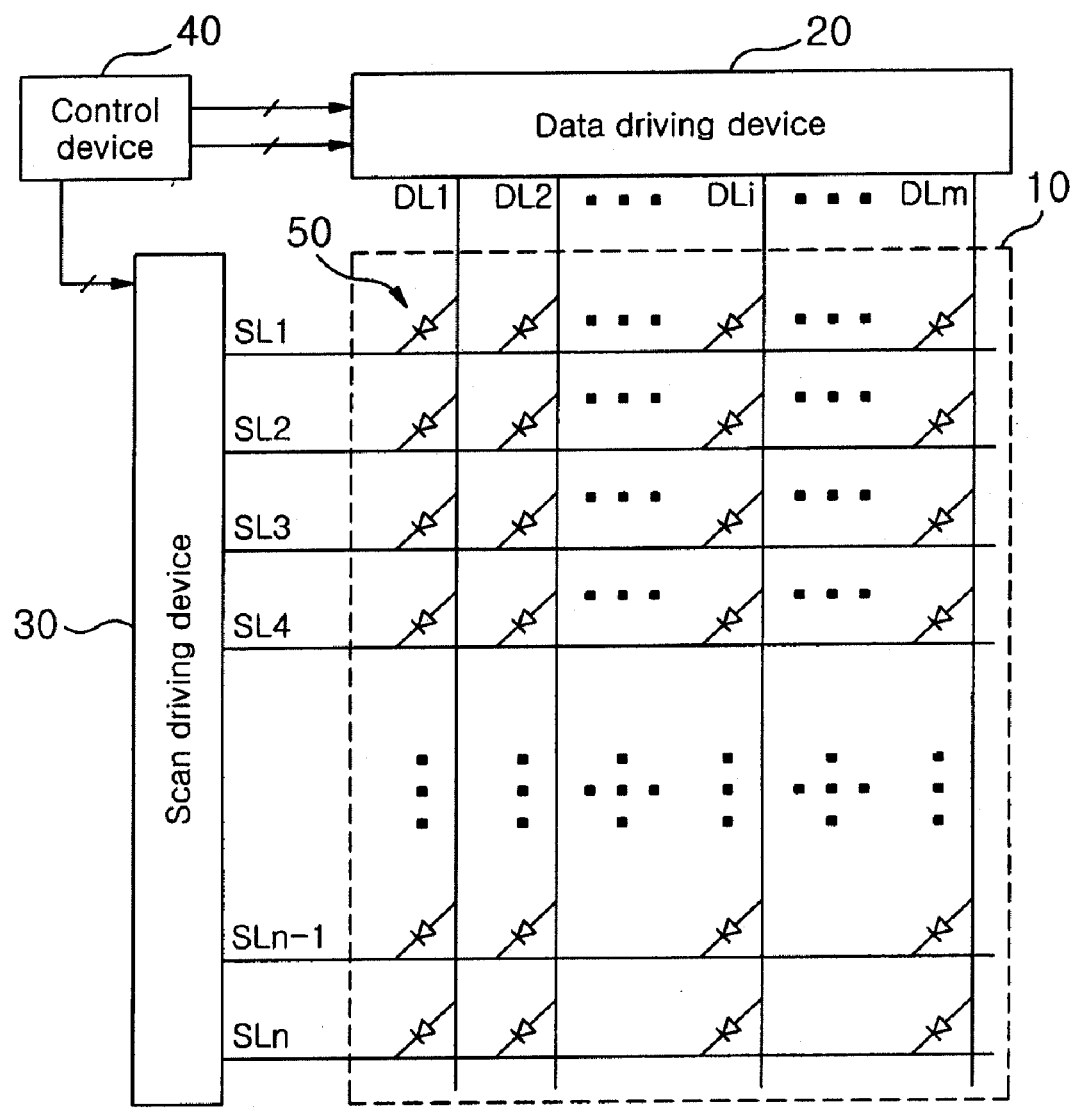
FIG. 4 is a block diagram of a display apparatus according to an example arrangement.

FIG. 4 is a block diagram of a display apparatus according to an example arrangement. Other arrangements may also be provided such as disclosed, for example, in U.S. Publication Nos. 2006/0262049, 2006/0146827, 2006/0139262, and 2006/0055632, the entire disclosures of which are incorporated herein by reference. The display apparatus may be used in or formed as a rigid or flexible display for electronic books, newspapers, magazines, etc. The display apparatus may also be used in various types of portable devices (e.g., handsets, MP3 players, notebook computers, etc.), audio applications, navigation applications, televisions, monitors, or other types of devices that use a display, either monochrome or color.

As shown in FIG. 4, the display apparatus may include a panel 10, a data driving device 20, a scan driving device 30 and a control device 40. The panel 10 may also include a plurality of pixels 50 formed in cross areas of data lines (DL1 to DLm) and scan lines (SL1 to SLn). In accordance with one embodiment, data lines DL1 to DLm malt correspond to data lines 210 in FIG. 1 and scan lines SL1 to SLn may correspond to scan lines 212 and 214 in this same figure.

Figure 5:
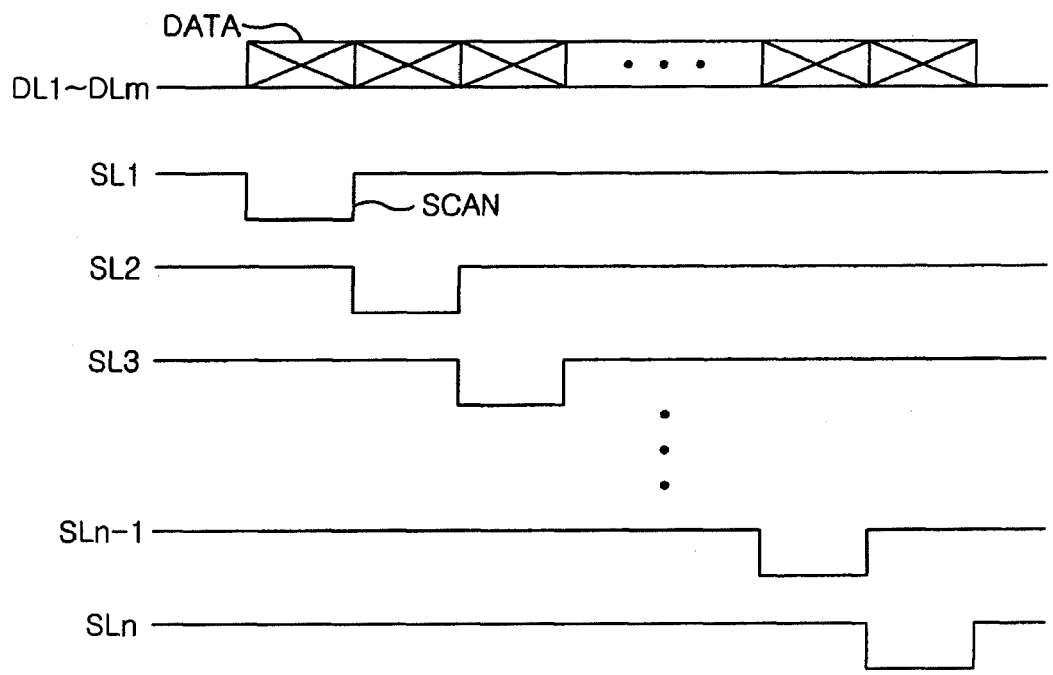
FIG. 5 is a timing diagram showing one example of scan signals being applied to scan lines according to an example arrangement.

The scan driving device 30 may transmit scan signals in sequence to the scan lines (SL1 to SLn). The data driving device 20 may transmit data signals in sequence to the data lines (DL1 to DLm). The data driving device 20 may use a pulse amplitude modulation (PAM) method or a pulse width modulation (PWM) method, for example, to apply the data signals to the data lines (DL1 to DLm). For example, FIG. 5 is a timing diagram showing one example of scan signals that may be applied to the scan lines by the scan driving device 30 and data signals that may be applied to the data lines by the data driving device 20.

Figure 6:
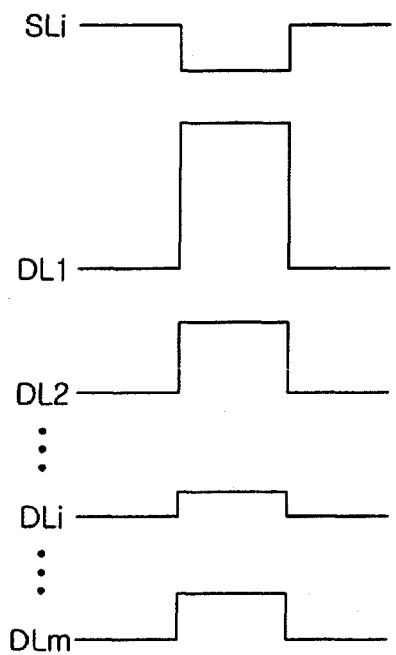
FIG. 6 is a timing diagram showing a method of driving a panel using a pulse amplitude modulation (PAM) method.

FIG. 6 is a timing diagram showing a method of driving the panel 10 using a PAM method. The data driving device 20 may apply data signals (i.e., data current corresponding to the digital video data) to the data lines (DL1 to DLm) by using the PAM method. In the PAM method, a gray scale of the pixels may be proportionate to an amplitude of the data current. In the data current, a time to have high logic may be constant irrespective of the gray scale corresponding to the digital video data. Other driving methods are disclosed in U.S. Publication Nos. 2005/0151707, and 2006/0146827, the entire disclosures of which are incorporated herein by reference.

Figure 7:
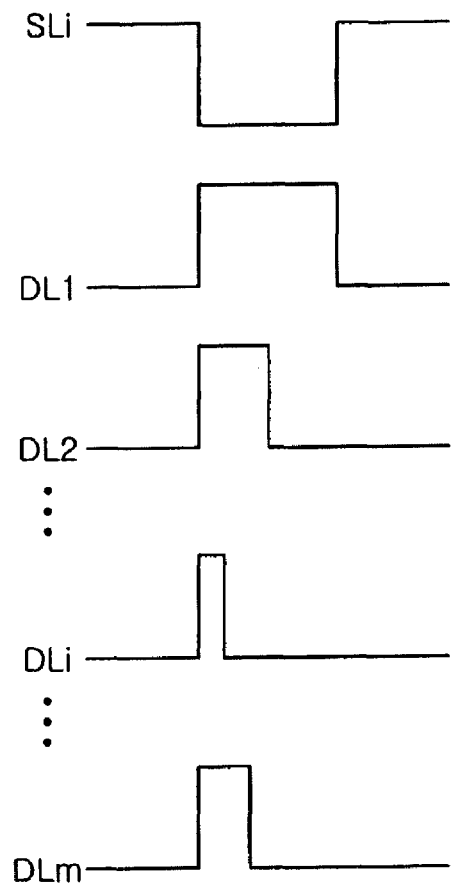
FIG. 7 is a timing diagram showing a method of driving a panel using a pulse width modulation (PWM) method.

FIG. 7 is a timing diagram showing a method of driving the panel 10 using a PWM method. The data driving device 20 may apply data signals (i.e., data current corresponding to the digital video data) to the data lines (DL1 to DLm) by using the PWM method. In the PWM method, a gray scale of the pixels may be proportionate to a time of high logic in the data current. The amplitude of the data current may be constant irrespective of the gray scale corresponding to the digital video data. Other driving methods are disclosed in U.S. Pat. Nos. 7,119,733, 6,914,388, and U.S. Publication No. 2006/0146827, the entire disclosures of which are incorporated herein by reference.

The data driving device 20 may use either a PAM current generating circuit and/or a PWM current generating circuit to drive the panel 10 depending on a gray scale level of an image signal as detected by the control device 40. When image signals having a relatively high gray scale level are to be displayed, the PAM method may be used to minimize power consumption. When image signals having a relatively low gray scale level are to be displayed, the PWM method may be used to ensure that good image quality is maintained. Other methods may also be used.

Figure 8:
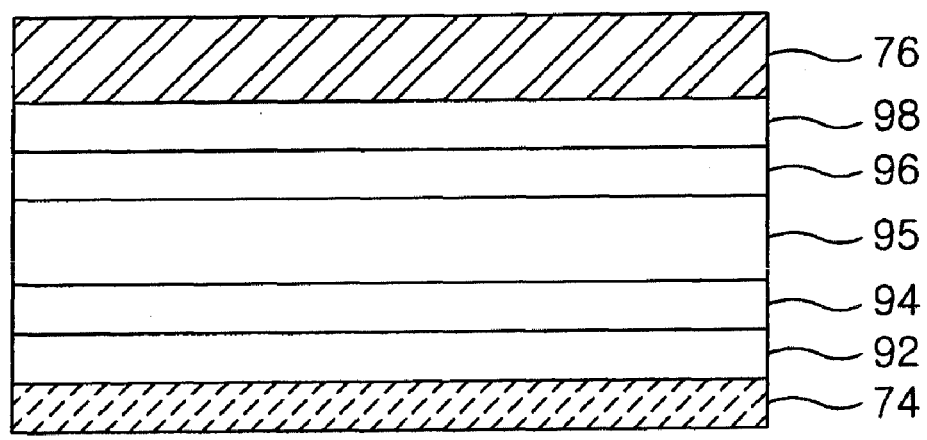
FIG. 8 shows an organic electroluminescent (EL) device according to an example arrangement.

FIG. 8 shows details of the light emitting device, e.g., an organic electroluminescent device, according to an example arrangement. Other arrangements may also be used such as illustrated, for example, in U.S. Pat. Nos. 6,864,637, 7,142,179, 7,038,373, and 7,023,013, the entire disclosures of which are incorporated herein by reference.

As shown in FIG. 8, the light emitting layer 304 in FIG. 2C may include a plurality of layers. These layers may include a hole injecting layer (HIL) 92 formed on the anode electrode layer 202A, a hole transporting layer (HTL) 94 formed on the HIL 92, an organic electroluminescent layer 95 formed on the HTL 94, an electron transporting layer (ETL) 96 formed on the HTL 94, and an electron injecting layer (EIL) 98 formed on the ETL 96. The cathode electrode layer 204 may be formed over the ETL 96. One or more of the HIL, HTL, ETL and EIL may be omitted, depending on the particular device structure adopted. If the EIL is omitted, cathode electrode layer 204 may be formed on ETL 96. In an alternative arrangement, the anode and cathode layers may be switched in terms of their position in FIG. 8.

Also, in other embodiments, the light emitting device may be an inorganic electroluminescent device having a similar structure. Further, depending on the materials used for the cathode, anode and substrate, the electroluminescent device can emit light through a transparent cathode, or through the transparent anode and substrate, or through both (bi-directional).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the preview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A display device comprising:
    a plurality of first electrode layer formed in a first direction; and
    a plurality of second electrode layer foil led in a second direction and crossing the first electrode layer to form a plurality of sub-pixel, each sub-pixel having a light emitting layer formed between the first electrode layer and the second electrode layer,
    wherein one of the first electrode layers and one of the second electrode layers forms one of the sub-pixels, one end portion of the second electrode layer has a dimension different from a dimension of the one of the sub-pixel in the first direction, and other portions of the second layer have a dimension same with the dimension of the one of the sub-pixel in the first direction.

2. The display device of claim 1, wherein the dimension of said one end portion of the second electrode layer is greater than the dimension of said one of the sub-pixel in the first direction.

3. The display device of claim 2, wherein the dimension of said one end portion of the second electrode layer substantially corresponds to the dimensions of two sub-pixels.

4. The display device of claim 2, wherein the dimension of said one end portion of the second electrode layer is greater than the dimensions of two sub-pixels.

5. The display device of claim 1, further comprising:
    a contact hole section to electrically couple a scan line to the second electrode layer, the contact hole section having a dimension that substantially corresponds to a dimension of the second electrode layer.

6. The display device of claim 5, wherein the dimension of the contact hole section substantially corresponds to the dimension of said one end portion of the second electrode layer.

7. The display device of claim 5, wherein the first electrode layer is electrically coupled to a data line.

8. The display device of claim 1, further comprising:
    a contact hole section to electrically couple a scan line to the second electrode layer, the contact hole section having a dimension that corresponds to a recess formed along said one end of the second electrode layer.

9. The display device of claim 1, further comprising:
    a wall located between the two neighboring second electrode layers for separating the plurality of second electrode layers from each other.

10. The display device of claim 1, wherein the display device is a top-type display device.

11. The display device of claim 1, wherein the first electrode layer is an anode layer and the second electrode layer is a cathode layer.

12. The display device of claim 1, wherein the first electrode layer is a cathode layer and the second electrode layer is an anode layer.

13. The display device of claim 1, wherein the display device is a bottom-type display device.

14. A display panel, comprising:
    a first plurality of scan lines;
    a second plurality of scan lines;
    a cell section that includes a plurality of first electrode layers having a first constant width in a first direction and a plurality of second electrode layers having a second constant width in a second direction, the first and second directions being different such that the first and second electrode layers cross to form a plurality of display cells, each display cell including a light emitting layer formed between the first and second electrode layers, wherein one of the first electrode layers and one of the second electrode layers forms one of the display cells of which size is determined by the first constant width and the second constant width; and a plurality of contacts, wherein each contact electrically couples at least one of the plurality of first and second scan lines to a corresponding one end portion of the second electrode layers and wherein each contact has a dimension different from a dimension of one of the display cells in the first direction.

15. The display device of claim 14, wherein each of the plurality of display cells includes at least one sub-pixel area.

16. The display device of claim 14, wherein the dimension of the at least one contact is greater than the dimension of said one of the display cells in the first direction.

17. The display device of claim 16, wherein the dimension of the at least one contact substantially corresponds to the dimensions of two display cells in the first direction.

18. The display device of claim 16, wherein the dimension of the at least one contact is greater than the dimensions of two display cells in the first direction.

19. The display panel of claim 14, wherein the dimension of the at least one contact substantially corresponds to a dimension of the one end portion of the second electrode layer in the first direction.

20. The display device of claim 14, wherein the dimension of the at least one contact corresponds to a recess formed along said one end portion of a corresponding one of the second electrode layers.

21. The display device of claim 14, wherein the cell section further includes a plurality of walls located between the two neighboring second electrode layers for separating the plurality of second electrode layers from each other.

22. The display device of claim 21, wherein each wall splits into a first portion separating a first plurality of adjacent display cells and a second portion separating a second plurality of adjacent display cells.

* * * * *